United States Patent
Tan et al.

(10) Patent No.: US 8,524,052 B1
(45) Date of Patent: Sep. 3, 2013

(54) COOLING SHOWER PLATE FOR DISK MANUFACTURE

(75) Inventors: Yi Chun Tan, Penang (MY); Choo Fooi Chew, Bukit Tengah (MY); Siewboon Tan, Penang (MY); Lee Chu Liew, Penang (MY)

(73) Assignee: WD Media, LLC, San Jose, CA (US)

( * ) Notice: Subject to any disclaimer, the term of this patent is extended or adjusted under 35 U.S.C. 154(b) by 536 days.

(21) Appl. No.: 12/753,818

(22) Filed: Apr. 2, 2010

(51) Int. Cl.
*C23C 14/34* (2006.01)
*C23C 16/00* (2006.01)

(52) U.S. Cl.
USPC ..................... 204/298.09; 118/724

(58) Field of Classification Search
USPC ..................... 204/298.09; 118/724
See application file for complete search history.

(56) References Cited

U.S. PATENT DOCUMENTS

| | | | |
|---|---|---|---|
| 5,094,013 A | 3/1992 | Martin et al. | |
| 5,181,556 A * | 1/1993 | Hughes | 165/80.1 |
| 5,997,588 A | 12/1999 | Goodwin et al. | |
| 6,119,368 A | 9/2000 | Masterson | |
| 6,408,537 B1 | 6/2002 | Aswad | |
| 6,530,993 B2 | 3/2003 | Hwang et al. | |
| 6,883,250 B1 | 4/2005 | Aggarwal et al. | |
| 7,000,418 B2 | 2/2006 | Rogers et al. | |
| 7,147,720 B2 | 12/2006 | Aggarwal et al. | |
| 7,462,560 B2 | 12/2008 | Chiang et al. | |
| 2002/0034595 A1 | 3/2002 | Tometsuka | |
| 2004/0040509 A1 | 3/2004 | Lu et al. | |
| 2008/0098762 A1 | 5/2008 | Kent | |
| 2008/0124947 A1 | 5/2008 | Kudo | |
| 2011/0114623 A1* | 5/2011 | Goodman et al. | 219/385 |

FOREIGN PATENT DOCUMENTS

| | | |
|---|---|---|
| EP | 829904 A2 | 9/1996 |
| JP | 2001250788 A | 12/1999 |
| WO | 9903138 A1 | 7/1997 |

* cited by examiner

Primary Examiner — Rodney McDonald

(57) ABSTRACT

Apparatus and method for cooling a recording media disk in a deposition system. A manifold spacer including an input port to receive a coolant gas and a first output port to output the coolant gas couples a pair of cooling plates together, the pair of cooling plates having opposing surfaces spaced apart by the manifold spacer to accommodate a passage of disks to be cooled. A first shower manifold is coupled to a first of the pair of cooling plates, the first shower manifold receives the coolant gas from the first output port in the manifold spacer and outputs the coolant gas flow in a first direction perpendicular to the opposing cooling plate surfaces and toward the media disk to be cooled.

10 Claims, 6 Drawing Sheets

US 8,524,052 B1

COOLING SHOWER PLATE FOR DISK MANUFACTURE

TECHNICAL FIELD

Embodiments of the invention described herein relate to the field of recording media disk manufacture and more specifically to cooling plates for cooling of media disks during their manufacture.

BACKGROUND

A disk drive is a data storage device that stores data in concentric tracks on a recording media disk. During operation, the disk is rotated about an axis by a spindle motor while a transducer (head) reads/writes data from/to a target track of the disk. The magnetic recording media utilized in particular recording media disks has begun to incorporate new media technologies, such as new materials for perpendicular magnetic recording layers, in an effort to increase storage density. Many of these new media technologies entail sputtering processes performed at higher temperatures than in previous technologies. As such, the media disk at certain points during manufacture will need to be cooled down from the higher deposition temperature to a subsequent temperature more conducive to further processing, such as the formation of a carbon overcoat (COC) via a chemical vapor deposition (CVD) process.

FIG. 1A illustrates an isometric view of a conventional cooling system 100 employed within a cooling chamber of an exemplary deposition system utilized in the manufacture of magnetic media disks. As shown, the cooling system 100 includes a first cooling plate 105 positioned with a major surface opposing that of a second cooling plate 106. An external surface of each of the first and second cooling plates 105, 106 is coupled to a cooling coil 115 which forms part of a coolant loop through which a coolant may pass to chill the cooling plates 105, 106. The first and second cooling plates 105, 106 are further coupled together at an edge by a spacer 110 to form a gap between the cooling plates 105, 106 through which a disk carrier 55 holding one or more media disks 50 may be disposed or passed through during a production operation. While the disk carrier 55 is disposed between opposing internal surfaces of the cooling plate 105 and 106, a coolant gas 120 is introduced through an input port 118 disposed in the spacer.

FIG. 1B illustrates a cross-sectional view of the cooling system 100 along the x-axis of the isometric view illustrated in FIG. 1A. The arrows illustrate the general direction of the coolant gas 120. As shown in FIG. 1B, after being introduced at the input port 118, the coolant gas 120 passes through the spacer 110 and flows on either side of the carrier 55 in a direction substantially parallel to both the front and back sides of the media disks 50 and the opposing surfaces of the cooling plates 105, 106. The coolant gas 120 then exits out an output (pump) port disposed at an edge (not depicted) opposite the spacer 110 to be pumped out by a pump stack (e.g., a turbomolecular pump backed by a roughing pump). Stated another way, there is a pressure drop along the y-dimension in FIG. 1 such that the coolant gas pressure at the edge of the media disk 50 proximate to the input port 118 is higher than at the edge of the media disk 50 distal from the input port 118 or proximate to a pump port.

Because a media deposition system is operated under vacuum, the cooling chamber typically operates at a nominal pressure of approximately 1 Torr. As such, cooling of the media disk 50 is dependent on heat transfer between the media disk 50 and the cooling plates 105, 106 across the spacing through which the coolant gas 120 passes. Because this heat transfer is sensitive to the coolant gas pressure, both nominal cooling rate and cooling rate uniformity are limited in the cooling system 100. For existing deposition systems to adopt the new manufacturing technologies requiring higher disk temperatures without incurring a significant reduction in disk throughput, it is advantageous to improve the cooling efficiency of cooling chambers within the deposition system.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
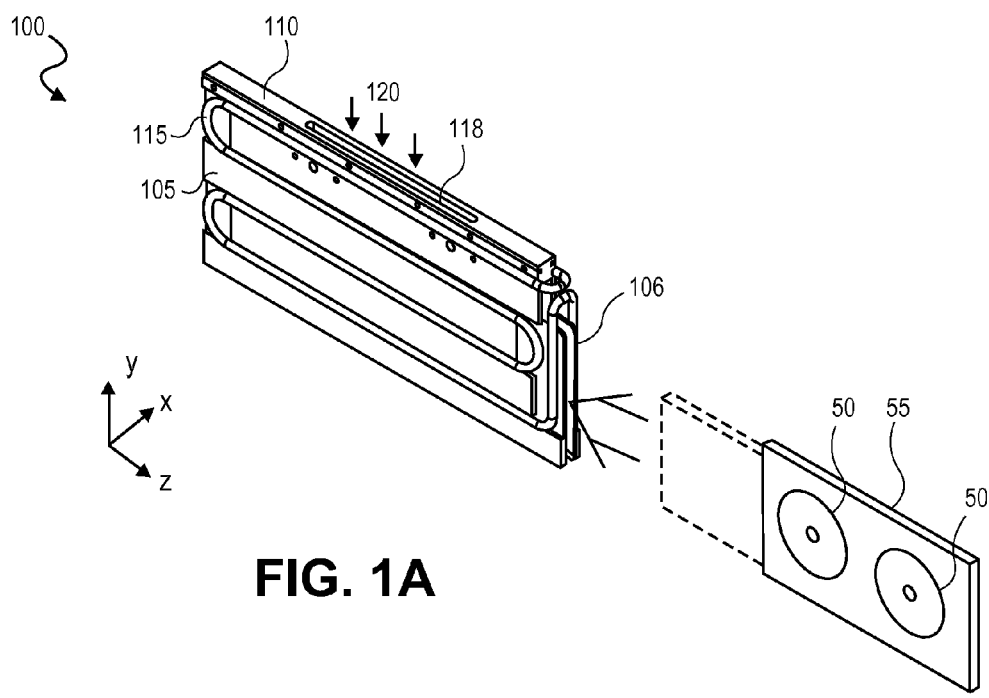
FIG. 1A illustrates an isometric view of a conventional cooling system employed within a cooling chamber of a deposition system.

In the following description, numerous specific details are set forth, such as dimensions and materials, to provide a thorough understanding of exemplary embodiments of the present invention. It will be apparent, however, to one skilled in the art that these specific details need not be employed to practice all embodiments of the present invention. Well known components or methods have not been described in detail to avoid unnecessarily obscuring various embodiments of the present invention.

The terms "coupled to," "disposed between," and "connected to" as used herein refer to a relative position of one component with respect to other components. As such, for example, one component "coupled to" another component may be in direct physical contact with the other component or may have one or more intervening components. Moreover, one component "disposed between" two components may be directly in contact with the two components or may have one or more intervening components or spacing. In contrast, a first component "connected to" a second component is in direct contact with that second component.

Embodiments described herein include a high efficiency cooling system capable of lowering the temperature of a media disk under manufacture at a faster rate than conventional cooling systems to allow higher layer deposition temperatures without increasing cooling time. As such, a deposition system is able to produce disks with higher data storage density. The high efficiency cooling systems described herein may further enable a superior CVD carbon overcoat process because the quality of the overcoat carbon may be improved at lower process temperatures. The high efficiency cooling systems described herein may further allow for improvements in throughput of a deposition system where deposition temperatures are such that the thermal load on the cooling system is not increased in proportion with the increased cooling power provided by the high efficiency cooling system embodiments described herein.

In certain embodiments of the high efficiency cooling systems described herein, the coolant gas flow is directed toward a media disk surface in a direction perpendicular to a major surface (i.e., front side or back side) of the media disk to improve heat transfer between a cooling plate and the media disk. In another embodiment of the invention, the coolant gas is introduced through the cooling plate at a point proximate to a center of the media disk such that the coolant gas flow has approximately radial symmetry about a central axis of the disk for improved uniformity of cooling as well as increased rate of cooling. In another embodiment, the coolant gas is introduced through the cooling plate at a plurality of points, each of the points proximate to a center of a different media disk to provide a coolant gas flows that are uniform among the plurality of disks. In further embodiments of the invention, the high efficiency cooling systems described herein are readily adaptable to cooling chambers in existing deposition systems. For example, a cooling system retrofit may be made to upgrade a conventional cooling system to a high efficiency cooling system described herein.

Figure 2A:
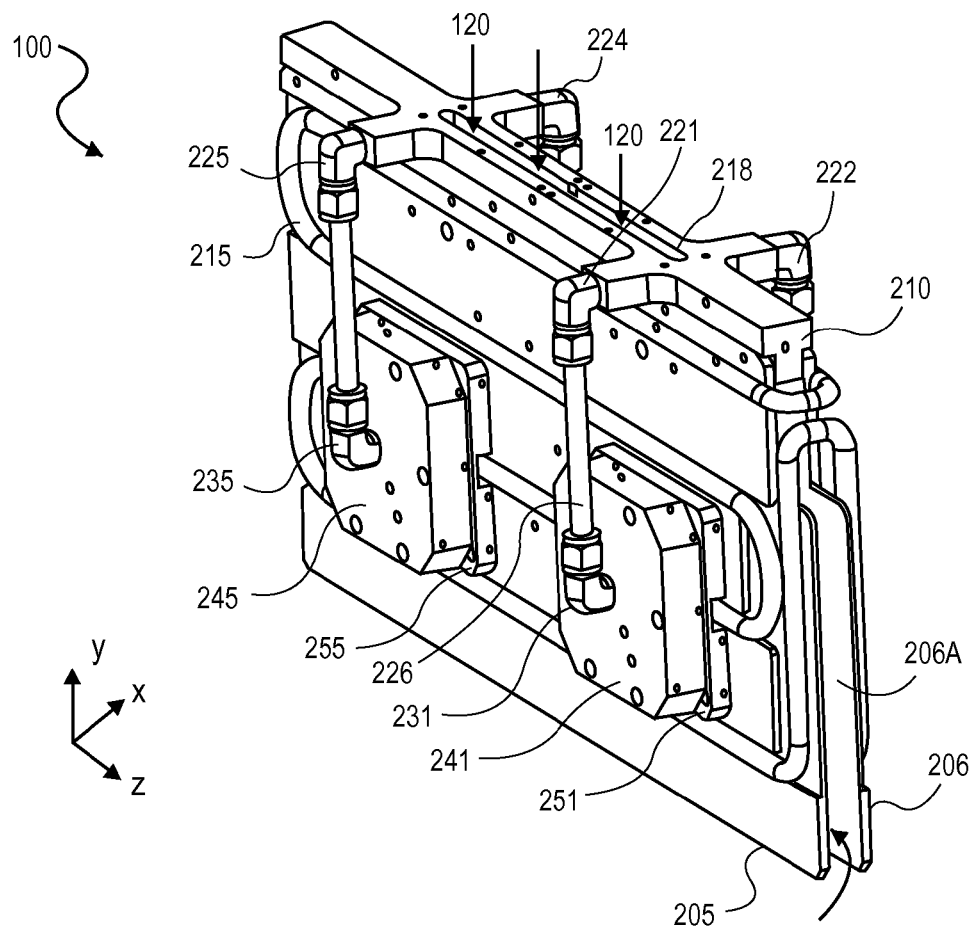
FIG. 2A illustrates an isometric view of a cooling system employed within a cooling chamber of a deposition system, in accordance with an embodiment of the present invention.

FIG. 2A illustrates an isometric view of a cooling system 200 employed within a cooling chamber of a deposition system, in accordance with an embodiment of the present invention. As shown, a first and second cooling plate 205 and 206 having opposing internal cooling plate surfaces 205A and 206A are coupled together at their edge by a manifold spacer 210. The manifold spacer 210 includes at least one input port 218 to receive an input coolant gas 120 and at least one output port to direct at least a portion of the input coolant gas 120 to flow through plumbing external to the cooling plates 205, 206. In the exemplary embodiment depicted, the manifold spacer 210 includes four output ports 221, 222, 224 and 225 and in one such embodiment, the manifold spacer 210 is configured to equally apportion the input coolant gas 120 into equal fractions between the four output ports 221, 222, 224 and 225.

A conduit 226 couples the output port 221 to a shower manifold which further includes a shower plate 251 and a manifold sub-plate 241. In certain embodiments, the conduit 226 may be routed along the external surface of the cooling plate 205 and/or along the cooling coil 215 to help reduce the temperature of the coolant gas 120. The manifold sub-plate 241 is positioned along the cooling plate 205 to be adjacent to a media disk during a cooling operation. For example, in static systems in which the media disk 50 is to remain stationary during cooling, the manifold sub-plate 241 may be disposed along the y and z dimensions to be aligned with the position of the media disk 50 during cooling. For dynamic systems in which the media disk 50 is to be displaced during cooling, the manifold sub-plate 241 may be disposed along either of the y or z dimensions to be aligned with the static dimension of the media disk 50 (e.g., y dimension where the disk is displaced along the z dimension during cooling).

The manifold sub-plate 241 preferably spans an area at least equal to the area of the media disk to be cooled during operation. The manifold sub-plate 241 may further define an interior cavity (not shown) spanning an area at least equal to the area of the media disk surface. The shower plate 251 seals the internal cavity formed by the manifold sub-plate 241. The shower plate 251 is further coupled to the cooling plate 205 and provides a plurality of apertures dispersed along the cooling plate surface. Coolant gas 120 may be output through the apertures in a direction perpendicular to the cooling plate 205 and toward a front side media disk surface. As discussed further elsewhere herein, the plurality of apertures are to be immediately adjacent to the media disk 50 during a cooling operation such that the coolant gas 120 is introduced through the cooling plate 205 in a region localized around the media disk 50 to maximize heat transfer from the media disk 50.

In a similar manner, each of the other output ports 222, 224 and 225 are coupled through conduit to individual shower manifolds to direct coolant gas toward both front and back side surfaces of one or more media disks held by the carrier during manufacture. For example, as shown in FIG. 2A, a manifold sub-plate 245 is coupled to the shower plate 255 to form a second shower manifold at a location spaced apart from the first shower manifold (241, 251). The second shower manifold is positioned on the surface of the cooling plate 205 to be proximate to a front side of a second media disk to be cooled concurrently with cooling of the first media disk. Similarly, the output ports 222 and 224 may be further coupled into third and fourth shower manifolds (not depicted) which are each affixed to the cooling plate 206 just as described for the cooling plate 205 to form pairs of opposing cooling shower manifolds. The third and further shower manifolds then provide coolant gas flow perpendicular to the internal surface 206A and directed in a direction opposite that of the shower manifolds coupled to the cooling plate 205. The additional shower manifolds fitted to the cooling plate 206 are to impinge back side surfaces of the first and second media disks, respectively.

As further shown, coupled to an external surface of a cooling plate 205 is a cooling coil 215 for chilling the cooling plate 205 with a liquid coolant, such as but not limited to a chlorofluorocarbon (CFC) which is circulating in a coolant loop at a low temperature (e.g., −120° C.). The cooling coil 215 is attached to the cooling plate 205, for example with a copper material, to reduce the operating temperature of the cooling plate 205 (e.g., to about −110° C.). Further coupled to the external surface of the cooling plate 205 is a first shower plate 251. As illustrated in FIG. 2A, a plurality of shower plates may be coupled to the external surface of the cooling plate 205. In the exemplary embodiment, a second shower plate 255 is coupled at a second position on the external surface of the cooling plate 205.

Figure 1B:
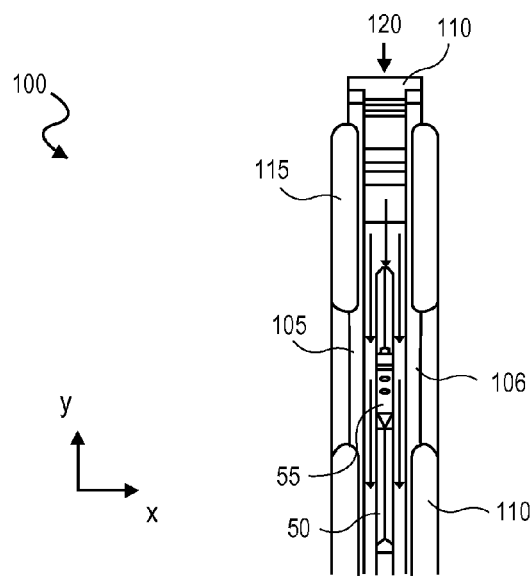
FIG. 1B illustrates a cross-sectional view of the cooling system along the x-axis of the isometric view illustrated in FIG. 1A.
Figure 2B:
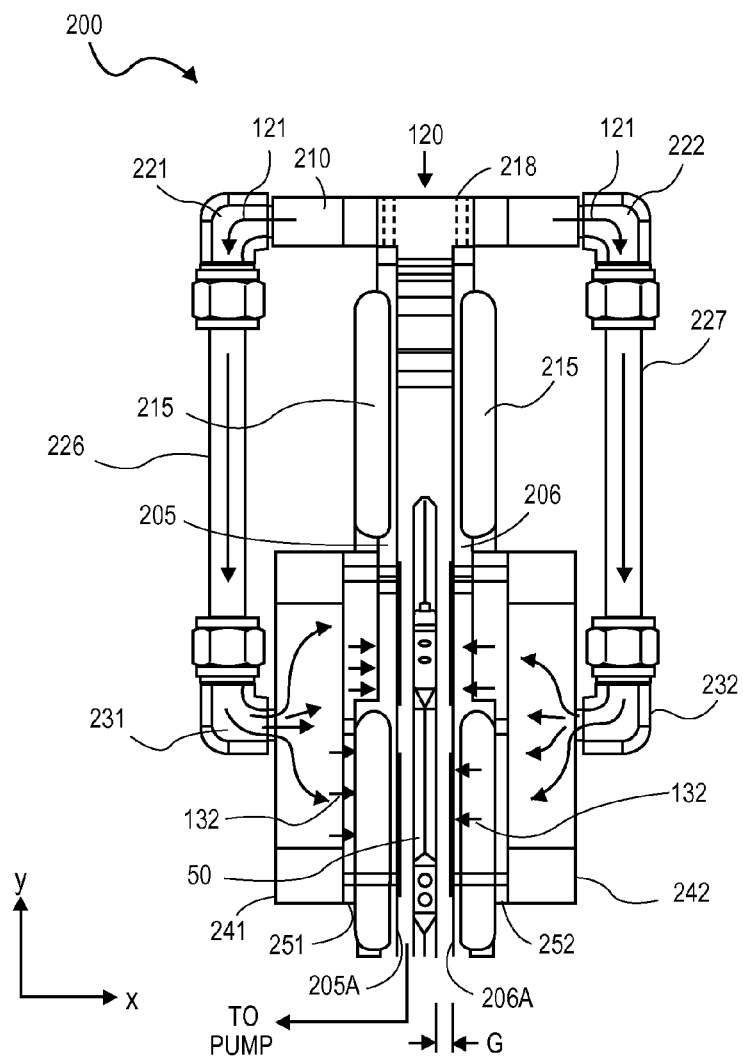
FIG. 2B illustrates a cross-sectional view of the cooling system taken along the x-axis of the isometric view illustrated in FIG. 1B, in accordance with an embodiment of the present invention.

FIG. 2B illustrates a cross-sectional view of the cooling system 200 along the x-axis of the isometric view illustrated in FIG. 1B, in accordance with an embodiment of the present invention. In FIG. 2B a carrier holding a media disk 50 is disposed between the opposing internal cooling plate surfaces 205A, 206A. A gap of dimension G is between major surfaces of the media disk 50 and the internal cooling plate surface 205A, 206A. The gap dimension G should be minimized for best heat transfer while still providing sufficient tolerance for a passage of disks to be cooled. Because the coolant gas 120 is introduced through the cooling plate portion directly adjacent to the media disk 50, reductions in the gap dimension G do not result in as sever of a pressure drop across the media disk 50 as in the cooling system 100. In an exemplary embodiment, the gap dimension G is between approximately 4.0 and 5.5 mm and is preferably between 4.0 and 4.5 mm. Other dimensions are also possible, dependent upon the carrier handling capabilities of the deposition system.

Arrows illustrate flow of the coolant gas 120 during operation of the cooling system 200. The coolant gas 120, preferably of a low molecular mass species, such as hydrogen or helium, is introduced at the input port 218 with a flow direction substantially parallel to the opposing internal cooling plate surfaces 205A and 206A. However, rather than passing between the opposing internal cooling plate surfaces 205A and 206A, as was illustrated in FIG. 1B, the manifold spacer 210 directs the coolant gas via the output ports 221 and 222 into the conduits 226, 227 running adjacent to an external surface of the cooling plates 205, 206 (output ports 224 and 225 and associated external plumbing are not visible in the FIG. 2B view). The conduits 226, 227 may be sized to provide minimal pressure drop. For example, in one embodiment where the output ports 221 and 222 include Swagelok elbow fittings, ⅜" I.D. stainless steel piping is coupled to the output ports 221 and 222 and the input ports 231 and 232. In a further embodiment, similar conduits route coolant fluid from the manifold spacer 210 via the additional output ports 224 and 225 to input ports in a second pair of opposing cooling shower manifolds (e.g., input port 235). As further illustrated in FIG. 2A, coolant gas portions 121, each representing a equal fraction of the coolant gas 120 (e.g., ¼ of flow rate at the input port 218) as determined by the fluid dynamics of the manifold spacer 210, flows into a manifold sub-plate 241 or 242. This configuration of a manifold spacer 210 enables quick retrofit of existing deposition systems with no need for modification of the coolant gas plumbing external to the cooling system 200.

The coolant gas portions 121 are then each distributed across a plurality of apertures disposed in opposing shower plates 251, 252. Depending on the embodiment, each shower plate may either be a portion of the cooling plate in which the apertures are machined or it may be a machined component separate from the cooling plate which is then affixed to the cooling plate to seal an opening in the cooling plate. For either embodiment, the manifold sub-plate may be mated to a shower plate via an o-ring seal, or preferably via a flat surface metal to metal contact as o-rings rapidly fail at the operating temperature of the cooling plate 206 (e.g., −100° C.).

Figure 3A:
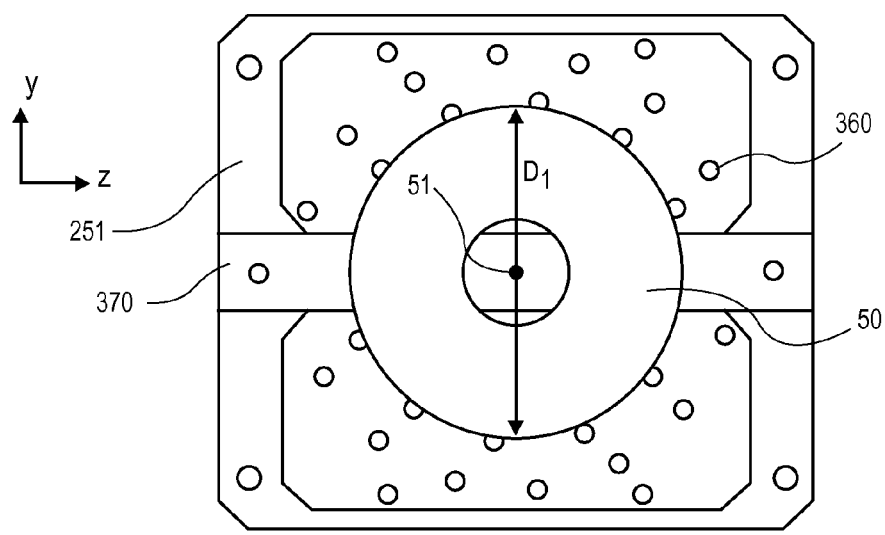
FIG. 3A illustrates a side view of a media disk of a first diameter disposed adjacent to a cooling shower plate, in accordance with an embodiment of the present invention.
Figure 3B:
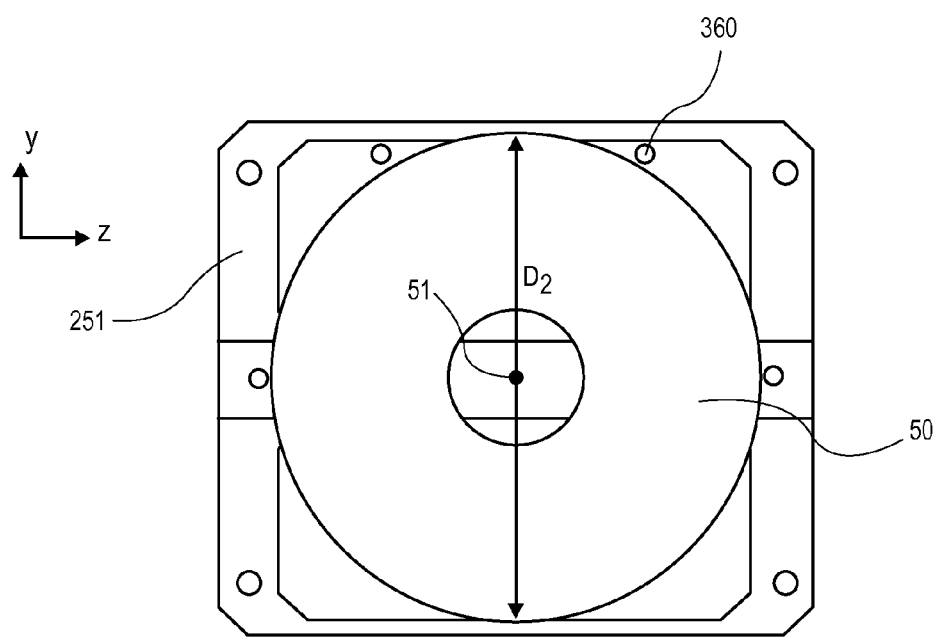
FIG. 3B illustrates a side view of a media disk of a second diameter disposed adjacent to a cooling shower plate, in accordance with an embodiment of the present invention.

FIGS. 3A-3B illustrate side views of media disks of differing diameters disposed adjacent to the cooling shower plate 251, in accordance with embodiments of the present invention. In FIG. 3A, the media disk 50 has a diameter D1, for example 65 mm, while the media disk depicted in FIG. 3B has a diameter D2, for example 95 mm. In the depicted embodiment, the shower plate apertures (360, 370) are disposed across a diameter approximately equal to the largest diameter media disk to be process by the deposition system (i.e., apertures extending over an area approximately equal to 95 mm$^2$). Such a sizing of the aperture area in the cooling shower plate ensures uniform cooling of the largest media size while maximizing the coolant gas pressure proximate to the media disk surface.

The coolant gas portions 121 depart from the shower plate apertures 360 in a direction substantially perpendicular to the shower plate 251 to impinge the surface of the media disk 50. Therefore, during operation of the cooling system 200, a small portion of the coolant gas 132 flows out of each of the shower plate apertures 360 to contact the media surface. With channeling of the coolant gas 120 to flow directly toward the major surface (e.g., a front side recording surface or a back side recording surface for double sided media) of a media disk to be cooled, it has been found that the efficiency of the cooling system 200 is significantly improved over that of the cooling system 100 (FIGS. 1A, 1B). In an embodiment, the shower plate apertures 360 provide a plurality of output ports which evenly distribute the coolant gas portions 121 across the front side and/or back side of the media disk 50. In a particular embodiment, each of the shower plate apertures 360 is of a same dimension to separate the coolant gas portions 121 into a plurality of equivalent gas outlets. For certain embodiments in which a plurality of shower plates are employed (e.g., shower plates 251, 252 for a single media disk embodiment and shower plates 251, 252, 254 and 255 for a dual media disk embodiment), each of the plurality of apertures across the plurality of shower plates provide approximately equal fractions of the coolant gas flow 120 received by the input port 218.

The size, number, and areal distribution of the apertures 360 may be optimized to provide the desired combination of coolant gas flow rate and flow rate uniformity. In exemplary embodiments, each of the shower plate apertures 360 has a diameter of between approximately 1 mm and 5 mm, with the preferred embodiment being approximately 3 mm. The shower plate apertures 360 may includes anywhere between approximately 10 and 50 apertures for a media disk diameter of 95 mm. In further embodiments, the shower plate apertures 360 have a substantially constant areal density. In the exemplary embodiment depicted, the shower plate apertures 360 are distributed symmetrically about the central disk axis 51 of the annular media disk 50. As such, the flow of the coolant gas is made approximately symmetric about the central disk axis 51 for improved uniformity of cooling. Recognizing that the rate of heat exchange between a cooling plate and the media disk 50 is a function of the coolant gas pressure within the gap G (FIG. 3B), with the coolant gas inlet immediately adjacent to the media disk, the pressure of the coolant gas proximate to the media disk is increased relative to the cooling system 100.

Figure 4:
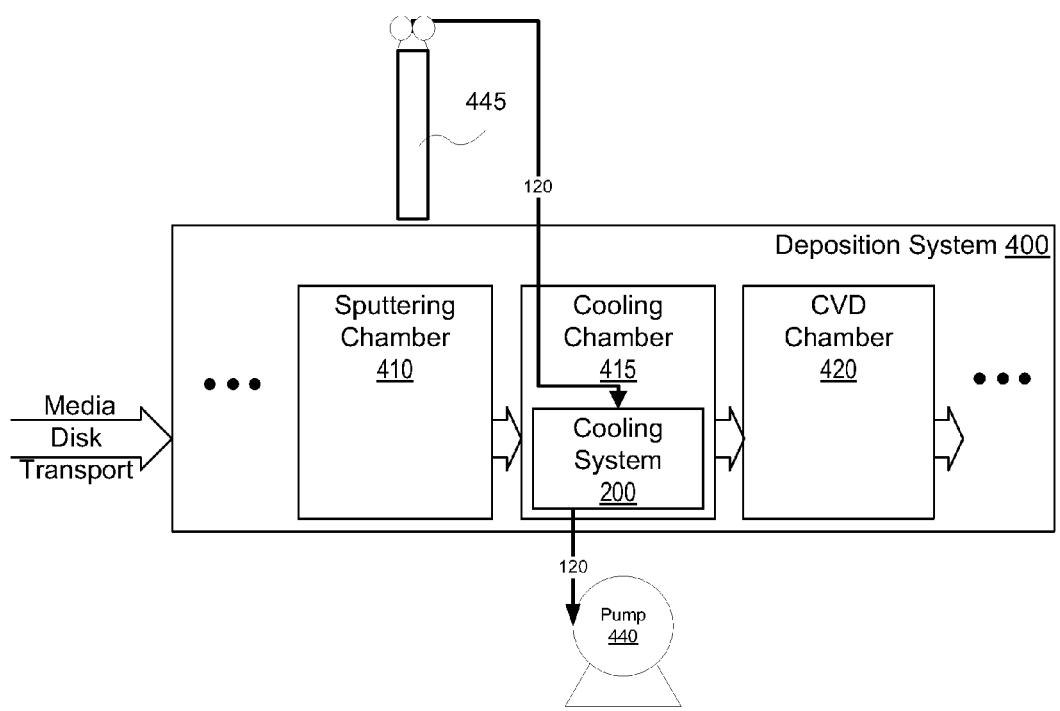
FIG. 4 illustrates a block diagram of an automated deposition system for manufacturing magnetic recording media disks, in accordance with an embodiment of the present invention.

FIG. 4 illustrates a block diagram of an automated deposition system 400 for manufacturing magnetic recording media disks, in accordance with an embodiment of the present invention. The deposition system 400 may be any system known in the art, such as a static deposition system available from manufacturers such as Intevac Inc. of Santa Clara, Calif. and Canon-Anelva Corp. of Japan or an in-line sputtering deposition system available from manufacturers such as Ulvac Corp. of Japan. The deposition system 400 includes a plurality of deposition chambers. Each deposition chamber may be of any type known in the art, such as, but not limited to, a sputter deposition chamber, an ion beam deposition chamber, a molecular beam deposition chamber, and a chemical vapor deposition (CVD) chamber. In the exemplary embodiment depicted in FIG. 4, the deposition system 400 includes a sputter deposition chamber 410 and a CVD chamber 420 configured to deposit a magnetic recording layer and a carbon overcoat, respectively. The deposition system 400 further includes a cooling chamber 415. The cooling chamber 415 has at least one cooling system 200, as further illustrated in FIGS. 2A-2B. The cooling system 200 is coupled (e.g., via the input port 218 depicted in FIGS. 2A and 2B) to a coolant gas source 445 external to cooling chamber 415. A turbo pump 440 is further coupled to the cooling system 200 (e.g., coupled to opposing cooling plate edges at one end of the cooling system 200) to pump the coolant gas 120 out of the cooling chamber 415 through the space between the opposing cooling plate surfaces, as further illustrated in FIG. 2B.

Figure 5:
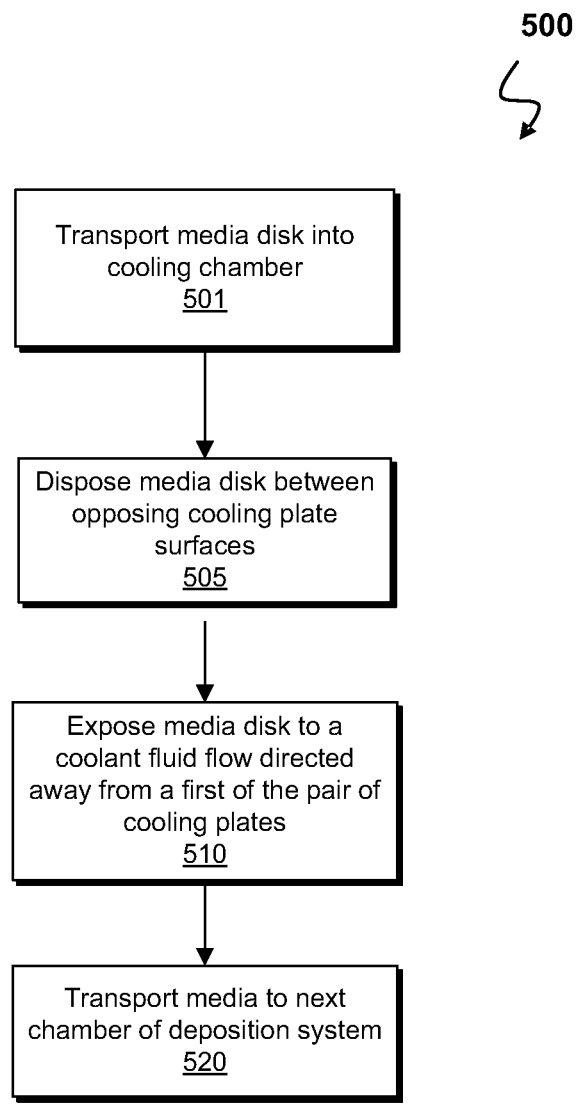
FIG. 5 illustrates a method of cooling a magnetic recording media disk in a deposition system, in accordance with an embodiment of the present invention.

FIG. 5 illustrates a method 500 for cooling a recording media disk in a deposition system, in accordance with an embodiment of the present invention. The cooling method 500 begins at operation 501 with transport of a media disk, such as the media disk 50 illustrated in FIG. 2B, into a cooling chamber, such as the cooling chamber 415 illustrated in FIG. 4. The media disk may be transported into the cooling chamber 415 from the sputtering chamber 410. At operation 501, the media disk is at a first temperature, for example at least 125° C., dependent on the deposition process performed in the sputtering chamber 410.

At operation 505, the media disk is disposed between opposing cooling plate surfaces either statically or dynamically (e.g., for in-line deposition systems where the media disk is displaced continuously). At operation 510, the media disk surfaces facing the opposing cooling plate surfaces are exposed to a coolant gas flow directed perpendicularly from at least a first internal cooling plate surface. In an exemplary embodiment, the media disk surfaces are exposed to the coolant gas flow for 4-10 seconds/media disk to reduce the temperature of the media disk to no greater than 105° C. in preparation for subsequent processing. While the coolant gas flow is directed from the coolant gas source 445 (FIG. 4) and away from the cooling plate surfaces at a direction substantially perpendicular to the media disk front and backsides, the coolant gas is plumped away from the media disk through a space between the opposing plate surfaces. In further embodiments, at operation 510 both a front side and a back side of the media disk are exposed to a coolant gas flow having a direction substantially perpendicular to the front and back disk sides.

Following the media disk cooling operation 510, the method 500 is completed at operation 520 with a transport of the media disk to the next chamber in the deposition system for further processing. In the particular embodiment depicted in FIG. 4, the media disk is transported from the cooling chamber 415 to the CVD chamber 420. In one such embodiment, a carbon layer is deposited on the media disk using CVD techniques known in the art.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. An apparatus for cooling a recording media disk in a deposition system, the apparatus comprising:
a manifold spacer including an input port to receive a coolant gas and a first output port to output the coolant gas;
a pair of cooling plates coupled together at first edges by the manifold spacer, the pair of cooling plates having opposing surfaces spaced apart by the manifold spacer to accommodate a passage of disks to be cooled; and
a first shower manifold coupled to a first of the pair of cooling plates, the first shower manifold to receive the coolant gas from the first output port and to output the coolant gas flow in a first direction perpendicular to the opposing cooling plate surfaces.

2. The apparatus as in claim 1, wherein the manifold spacer further includes a second output port to output the coolant gas, and wherein the apparatus further comprises:
a second shower manifold coupled to a second of the pair of cooling plates at a position opposite that of the first shower manifold, the second shower manifold to receive the coolant gas from the second output port and to output the coolant gas in a second direction perpendicular to the opposing cooling plate surfaces, the second direction opposite the first direction.

3. The apparatus as in claim 2, wherein the manifold spacer further includes a third output port to output the cooling fluid, and wherein the apparatus further comprises:
a third shower manifold coupled to the first of the pair of cooling plates, the third shower manifold to receive the coolant gas from the third output port and to output the coolant gas in the first direction perpendicular to the opposing cooling plate surfaces, the third shower manifold spaced apart from the first shower manifold along the first cooling plate surface to be proximate to a first side of a first disk to be cooled while the first shower manifold is proximate to a first side of a second disk to be cooled.

4. The apparatus as in claim 3, wherein the manifold spacer further includes a fourth output port to output the cooling fluid, and wherein the apparatus further comprises:
a fourth shower manifold coupled to the second of the pair of cooling plates at a position opposite that of the third shower manifold, the fourth shower manifold to receive the coolant gas from the fourth output port and to output the coolant gas in the second direction perpendicular to the opposing cooling plate surfaces, the fourth shower manifold spaced apart from the second shower manifold along the second cooling plate surface to be proximate to a second side of the first disk while the second shower manifold is proximate to a second side of the second disk to be cooled.

5. The apparatus as in claim 4, wherein each of the first, second, third and fourth shower manifolds provide approximately equal fractions of the coolant gas flow received by the manifold spacer input port.

6. The apparatus as in claim 1, wherein the coolant gas flow at the input port is in a direction parallel to the parallel opposing cooling plate surfaces.

7. The apparatus as in claim 1, wherein the first shower manifold comprises a first plurality of apertures dispersed along the first cooling plate surface to provide a coolant gas flow that is symmetric about a center of a disk to be cooled.

8. The apparatus as in claim 7, wherein the first plurality of apertures extends over an area approximately equal to 95 $mm^2$.

9. The apparatus as in claim 8, wherein each of the first plurality of apertures has a diameter of approximately 3 mm, wherein the first plurality of apertures comprises between 20 and 50 apertures, and wherein the first plurality of apertures is spaced apart from a disk to be cooled by between 4.0 mm and 5.5 mm.

10. The apparatus as in claim 1, wherein the coolant gas is hydrogen and the opposing cooling plates are coupled to cooling coils which circulate a second coolant gas to lower the cooling plate temperature below an ambient temperature.

* * * * *